United States Patent [19]
Ohmi et al.

[11] Patent Number: 5,682,109
[45] Date of Patent: Oct. 28, 1997

[54] SEMICONDUCTOR INTEGRATED CIRCUIT

[75] Inventors: Tadahiro Ohmi, 1-17-301, Komegabukuro 2-chome, Aoba-ku, Sendai-shi, Miyagi-ken 980; Tadashi Shibata, 5-2, Nihondaira Taihaku-ku, Sendai-shi, Miyagi-ken 982-02; Koji Kotani, Sendai, all of Japan

[73] Assignees: Tadahiro Ohmi; Tadashi Shibata, both of Japan

[21] Appl. No.: 600,760

[22] Filed: Feb. 13, 1996

[30] Foreign Application Priority Data

Feb. 13, 1995 [JP] Japan .................... 7-024441

[51] Int. Cl.$^6$ .................................... G01R 19/00
[52] U.S. Cl. .................................... 327/57; 327/51
[58] Field of Search .................. 327/51–57, 208, 327/202; 395/24–27; 365/185.21

[56] References Cited

U.S. PATENT DOCUMENTS 4,103,185  7/1978  Denes .................... 327/208
5,029,136  7/1991  Tran et al. .............. 327/51
5,297,092  3/1994  Johnson ................... 327/51
5,537,066  7/1996  Kawashima ............... 327/55

*Primary Examiner*—Toan Tran
*Attorney, Agent, or Firm*—Baker & Daniels

[57] ABSTRACT

The present invention relates to a semiconductor integrated circuit. In greater detail, the present invention relates to a semiconductor integrated circuit which conducts calculations using a voltage adding function by means of capacity and threshold operations. The semiconductor integrated circuit in accordance with the present invention is characterized in that, in a circuit wherein the output of a first inverter circuit and the input of a second inverter circuit are connected at a first contact point, the output of the second inverter and the input of the first inverter are connected at a second contact point, and a means is provided for generating a difference in potential between the first contact point and the second contact point, an electrically floating electrode and a plurality of input electrodes, which are provided via capacity elements with this electrode, are provided, and a means is provided for in effect determining the difference in potential by means of the potentials applied to the input electrodes.

3 Claims, 7 Drawing Sheets

SEMICONDUCTOR INTEGRATED CIRCUIT

BACKGROUND OF THE INVENTION

1. Field of the Invention

The present invention relates to a semiconductor integrated circuit. In greater detail, the present invention relates to a semiconductor circuit which conducts calculations employing threshold operations and voltage adding functions by means of capacity.

2. Description of the Related Art

In semiconductor integrated circuitry, greater integration of the circuitry has proceeded as a result of the increasing miniaturization of the elements. When elements are miniaturized, it is possible not merely to increase the operating speed of the elements, but also to increase the number of elements which can be placed on a single chip, so that the functions of each chip increase. Microprocessor LSI is a good example of this; on current leading-edge microprocessor chips, the element size is on the order of 0.5 microns, and the number of elements per chip may be as much as a few million.

However, in concert with the miniaturization and large scale integration of the elements, various difficulties have been revealed. Since a fixed power source voltage is impressed on the minute elements, a strong electric field is generated within the elements, the accelerated carriers become hot carriers, and are implanted in the gate oxide film, so that the element characteristics worsen; this hot carrier problem is one of these difficulties. Furthermore, the problem of how best to conduct the layout and formation of the wiring which must connect as much as a few million elements to one another has again presented itself. Because of these problems, the technology is presently at a stage at which further miniaturization of the elements will be extremely difficult. Accordingly, it is difficult to foresee a future improvement in the functions of LSI chips.

These problems were solved by the invention of the neuron MOS transistor and logical circuitry employing such neuron MOS transistors (inventors: Tadashi Shibata, Tadahiro Ohmi, Japanese Patent Application, First Publication No. Hei 3-6679, and Japanese Patent Application, Second Publication No. Hei 4-816971). The neuron MOS transistor is a highly functional element having a function similar to that of living neurons, which has a plurality of input coupling electrodes which are capacitively coupled with a floating gate, and which calculates a weighted average of input signals from the plurality of input coupling electrodes at the floating gate level, and based on the results thereof, controls the ON/OFF state of the transistor.

In comparison to conventional transistors, which are termed 3-terminal devices because the ON/OFF state of a current flowing between two terminals is controlled by means of the third terminal, the neuron MOS transistor can be thought of as a 4-terminal device having a plurality of fourth terminals which are capable of controlling the control method of the third terminal, which controls the ON/OFF state of the current flowing between the other two terminals. Since the elements themselves are highly functional, when employed in logical circuitry, the number of elements and wiring required to realize a certain logical function is dramatically reduced in comparison with the case in which conventional CMOS logical circuitry is employed. Furthermore, flexible signal processing, which was not obtainable by means of circuitry employing conventional transistors in which the ON/OFF state was controlled by means of a determination as to whether a single input had a value of 0 or 1, can be easily realized, so that it is possible to construct flexible logical circuitry, matching circuitry in which rules vary in real time, winner-take-all circuitry, and highly functional circuitry such as associative memories or the like, in a simple manner. Furthermore, it is easily possible to realize a function in which characteristic features are extracted from an enormous amount of data, and employing this function, a simplification and increase in speed can be expected even in circuitry in the image data processing field, such as character recognition or the detection of image movement vectors. In this way, the neuron MOS transistor is a novel device which may hold the possibility of giving rise to completely new circuit technology leading to the realization of ultra high speed and ultra functional LSI.

This neuron MOS transistor possesses a floating gate, so that there has been a large problem with reliability. This problem is the change over time in the threshold value of the neuron MOS transistor which occurs during operation. This occurs primarily as a result of hot carrier implantation into the floating gate. In a common MOS transistor, almost all of the hot carriers implanted in the gate oxide film pass through the oxide film and are removed by the gate electrode, so that the amount of charge which is captured within the oxide film and alters the threshold value is only a small part of the amount of charge which is implanted. In the neuron MOS, almost all the charge which is implanted remains in the floating gate, so that even with an extremely small amount of implanted charge, there are dramatic changes in the threshold value of the neuron MOS transistor. Furthermore, as stated above, the neuron MOS transistor is a device which handles a plurality of values at the floating gate, so that the tolerable amount of change in the threshold value is small, and operational errors can result even as a result of a small amount of implanted charge.

These problems Were solved by an invention in which a switch element was connected to the floating gate of the neuron MOS transistor and the floating gate charge was appropriately reset; this invention was titled "Semiconductor Integrated Circuit" (applicants: Tadashi Shibata, Tadahiro Ohmi). By means of this invention, an improvement in reliability was achieved as a result of floating gate charge refresh, and additionally, a function was provided by means of which even the variation in threshold value resulting from the device manufacturing processes and the like was cancelled, and the accuracy of the calculations carried out by the MOS was also improved.

However, there Was a severe drawback present in the conventional neuron MOS circuit and the clock-controlled neuron MOS circuit having a floating gate switch. This was the increase in the power consumption per gate. As described above, the neuron MOS is a device which handles a plurality of values at the floating gate. Since the power source voltage swing is divided into a number of levels having differing values, the difference in potential between logical levels, that is to say, the logical swing, is small, and the period of time during which the floating gate potential is biased in the vicinity of the inversion threshold value of a neuron MOS inverter comprised of neuron MOS transistors is lengthened. In the transition region in the vicinity of the inversion threshold value, a through current flows, so that power consumption increases.

In clock-controlled neuron MOS circuitry provided with a floating gate switch and having an inversion threshold automatic correction function, when resetting is conducted, a method is employed in which the output of the neuron MOS inverter and the floating gate are shorted by means of the switch, and the inverter is forcibly biased at the inversion threshold. Accordingly, in a clock-controlled neuron MOS circuit provided with a floating gate switch, a through current flows not merely during calculation, but also during the resetting of the floating gate, and power is consumed in a steady manner, so that the power consumption per gate is further increased.

Furthermore, by providing a switch on the floating gate, it is possible to prevent operational errors resulting from charge implantation in the floating gate, and calculational accuracy was thus improved. However, in place of the charge implantation into the floating gate, a further factor limiting calculational accuracy was the noise resulting from the switch which was attached. This was the switching noise which is termed clock feed-through; here, at the time of the transition of the MOS transistor from an ON state to an OFF state as a result of the clock signal, the channel charge is divided among the source and drain of the MOS transistor, and is implanted into the load capacity connected thereto, so that the terminal voltage of the load capacity is altered. As a result of this noise, there was a limit to the increase in accuracy of the neuron MOS computing circuit.

As described in the foregoing, while neuron MOS transistors possessed strikingly high function, they also possessed a large drawback in that the constant power consumption per gate was large. Furthermore, there was a limit to the increase in accuracy of the computation.

SUMMARY OF THE INVENTION

The present invention has as an object thereof to provide a highly functional semiconductor integrated circuit which employs neuron MOS transistors and is capable of realizing circuitry which is able to cancel switching noise, without an accompanying constant power consumption during the resetting of the floating gate and during calculation.

The semiconductor integrated circuit in accordance with the present invention is characterized in that, in a circuit in which the output of a first inverter circuit and the input of a second inverter circuit are connected at a first contact point, the output of the second inverter and the input of the first inverter are connected at a second contact point, and in which a means is provided for generating a potential difference between the first contact and the second contact point; an electrode which is made electrically floating, and a plurality of input electrodes which are provided via capacity elements with this electrode, are provided, and a means by which the potential difference is effectively determined by the potentials applied to the input electrodes is provided.

In the present invention, using a differential amplification circuit which does not involve a constant power consumption in the neuron MOS transistor circuit, it is possible to execute threshold operations based on a addition result as a voltage dimension by means of neuron MOS with extremely low power consumption. Furthermore, the differential amplification principle is employed, so that it is possible to cancel the switching noises and the like which are introduced at both input terminals. By means of the above, it is possible to realize a neuron MOS integrated circuit which executes high-function calculation with good accuracy and low power consumption.

In accordance with a mode of the present invention, in an integrated circuit employing neuron MOS transistors, operation involving low power consumption which does not cause constant power consumption becomes possible. Furthermore, switching noise is canceled, so that the accuracy of calculations on multivalent signals using the floating gate is improved, and it is possible to conduct calculations having more functions.

In accordance with a further mode of the present invention, the sensing node of the differential amplification circuit is driven directly by the floating gate of the neuron MOS, so that the gain of the differential amplification is increased, and it is possible to realize an increase in calculational accuracy.

In accordance with a further mode of the present invention, the structure of the differential amplification circuit is simplified, the control signals are also simplified, and the number of clock cycles required for the calculations of one cycle are reduced, so that it is possible to realize a diminishment of the circuit surface area as a result of the reduction in the number of wires and to realize an increase in operational speed.

| (Description of the References) | |
|---|---|
| 101 | floating gate, |
| 102, 104 | PMOS transistors, |
| 103, 105 | NMOS transistors, |
| 106–108, 110 | contact points, |
| 109, 111–119 | switches, |
| 119 | inversion output terminal, |
| 120 | output terminal, |
| 201, 202, 203 | first stage basic logical calculation blocks, |
| 204 | second stage basic logical calculation blocks, |
| 205–207 | switches, |
| 401 | waveform of the inversion signal of clock signal $\Phi_{RS}$, |
| 402 | waveform of the inversion signal of $\Phi_{PR}$, |
| 403 | waveform of the inversion signal of $\Phi_{CN}$, |
| 404 | waveform of the inversion signal of $\Phi_{BV}$, |
| 405 | waveform of the potential of floating gate 101, |
| 406 | waveform of the potential of contact point 106, |
| 407 | waveform of the potential of contact point 107, |
| 601, 602 | neuron MOS transistors, |
| 603, 604 | floating gates, |
| 605, 607, 613–616 | PMOS transistors, |
| 606, 608, 612 | NMOS transistors, |
| 609–611 | contact points, |

-continued (Description of the References)

| | |
|---|---|
| 617, 618 | $N_{AND}$ gates, |
| 619 | inversion output teminal, |
| 620 | output terminal. |

DESCRIPTION OF THE PREFERRED EMBODIMENTS

Hereinbelow, the present invention will explained in detail using embodiments; however, it is of course the case that the present invention should not be construed to be limited to the embodiments described.

(First Embodiment)

Figure 1:
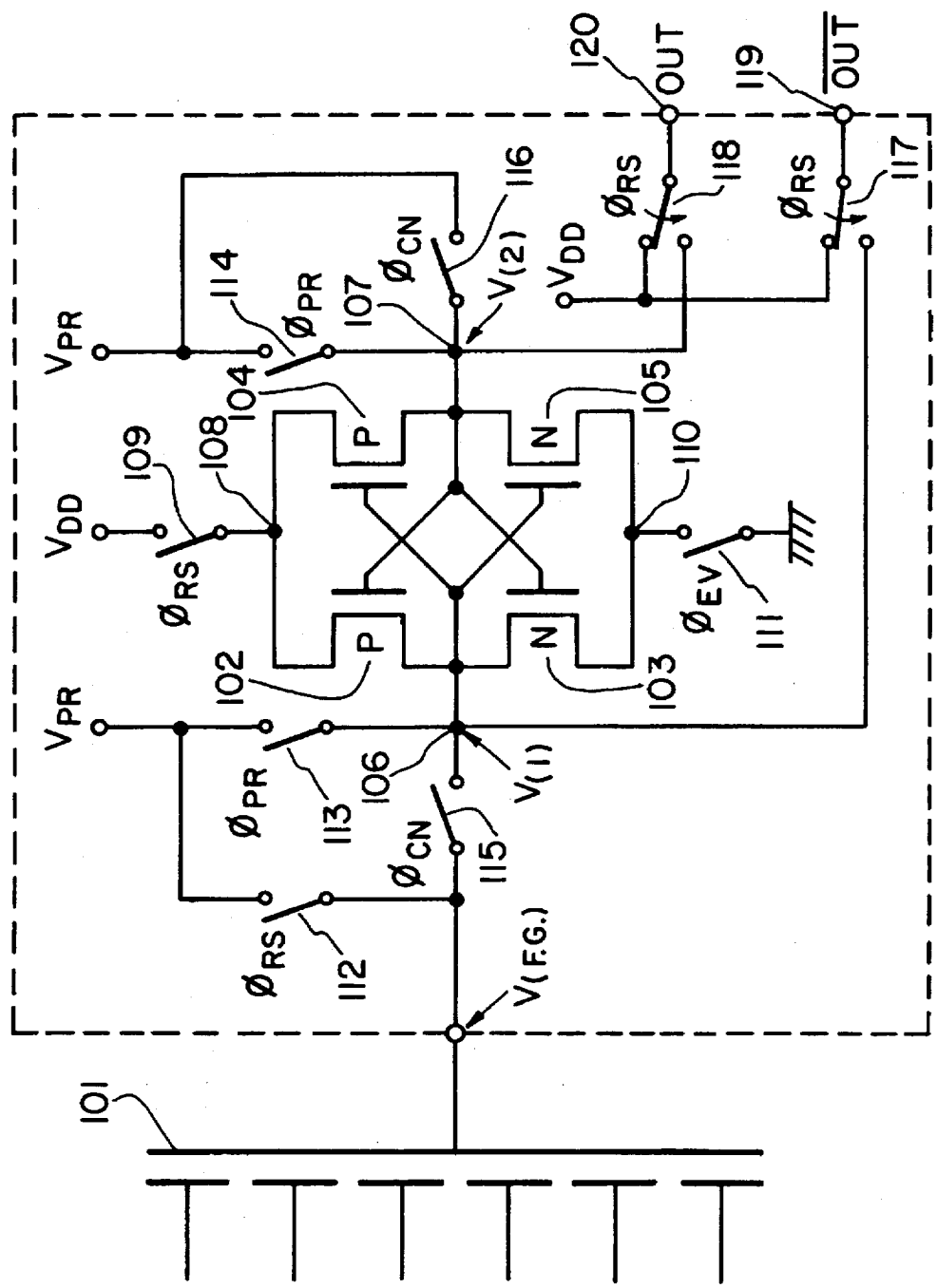
FIG. 1 is a structural circuit diagram showing a first embodiment of the present invention.

FIG. 1 is a structural circuit diagram showing a first embodiment of the present invention. This circuit is employed as a basic logical calculation block in a neuron MOS logical circuit. In the figure, reference 101 indicates the floating gate of the neuron MOS. References 102 and 103 indicate, respectively, a PMOS transistor and an NMOS transistor; they comprise a first inverter circuit. Furthermore, references 104 and 105 indicate, respectively, a PMOS transistor and an NMOS transistor; the constitute a second inverter circuit. The output of the first inverter and the input of the second inverter, as well as the output of the second inverter and the input of the first inverter, are connected via, respectively, first contact point 106 and second contact point 107. The source terminals of PMOS transistors 102 and 104 are connected at third contact point 108, and contact point 108 is connected to power source $V_{DD}$ by means of switch 109, which is turned on by the clock signal of $\Phi_{RS}$. Furthermore, the source terminals of NMOS transistors 103 and 105 are connected at fourth contact point 110, and contact point 110 is connected to a ground terminal by means of a switch 111 which is turned on by means of the clock signal of $\Phi_{EV}$.

The circuit comprising transistors 102, 103, 104, and 105 is a differential amplification circuit which amplifies the potential difference between contact point 106 and contact point 107. Floating gate 101 is connected to a precharge power source $V_{PR}$ via a switch 112 which is turned on by the clock signal $\Phi_{RS}$. Furthermore, contact points 106 and 107 are connected to the precharge power source $V_{PR}$ via switches 113 and 114 which are turned on by clock signal $\Phi_{PR}$. Additionally, contact points 106 and 107 are connected to, respectively, the floating gate 101 and the precharge power source $V_{PR}$ via switches 115 and 116, which are turned on by clock signal $\Phi_{CN}$. Furthermore, contact points 106 and 107 are connected to inversion output terminal 119 and output terminal 120 via switches 117 and 118. Switches 117 and 118 are controlled by clock signal $\Phi_{RS}$; when $\Phi_{RS}$ has value of 1, contact point 106 and inversion output terminal 117, and contact point 107 and output terminal 118, are connected, while when $\Phi_{RS}$ has a value of 0, inversion output terminal 117 and output terminal 118 are connected to power source $V_{DD}$.

Figure 2:
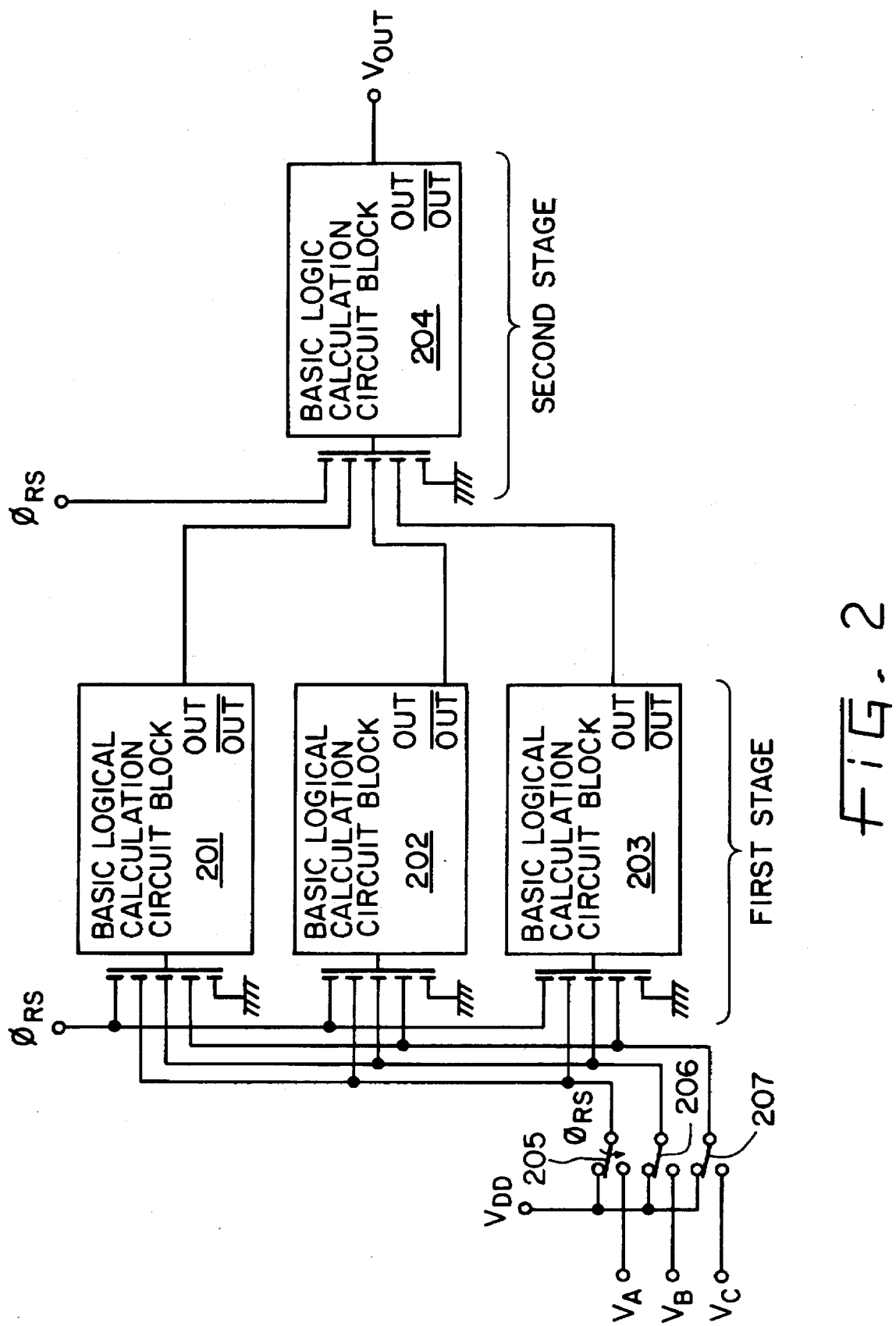
FIG. 2 shows an example of a logical circuit constructed using the basic logical calculation circuit; this circuit calculates the $X_{OR}$ of the three inputs $V_A, V_B$, and $V_C$.

An example of a logical circuit construction using these basic logical calculations circuits is shown in FIG. 2. The circuit shown in FIG. 2 calculates the $X_{OR}$ of the three inputs $V_A$, $V_B$, and $V_C$. This circuitry .comprises two stages of the basic logical calculation blocks shown in FIG. 1. Any logical function can be realized by means of a two stage structure of these neuron MOS basic logical calculation blocks.

The coupling capacity ratio of the neuron MOS floating gates is set so that the first stage basic logical calculation blocks 201, 202, and 203 determine whether, among the three inputs $V_A$, $V_B$, and $V_C$, there are 1 or more, 2 or more, or 3 or more inputs having a value of 1, respectively. The output terminal, inversion output terminal, and output terminal, respectively, of the first stage basic logical calculation blocks 201, 202, and 203 are connected at an equal coupling capacity to the floating gate of the second stage basic logical calculation block 204, and setting is conducted so that this block determines whether there are two or more inputs having an input of 1. Switches 205, 206, and 207 are controlled by clock signal $\Phi_{RS}$; when $\Phi_{RS}$ has a value of 1, these switches connect the input signals $V_A$, $V_B$, and $V_C$ with the input coupling capacities of basic logical calculation blocks 201, 202, and 203, while when $\Phi_{RS}$ has a value of 0, these switches connect the input coupling capacities of the basic logical calculation blocks 201, 202, and 203 with the power source $V_{DD}$. These function in the same manner as the switches 117 and 118 in the basic logical calculation block of FIG. 1. The calculation proceeds through a first stage basic logical calculation block and the second stage basic logical calculation block in a pipeline form, one stage per cycle.

Figure 3:
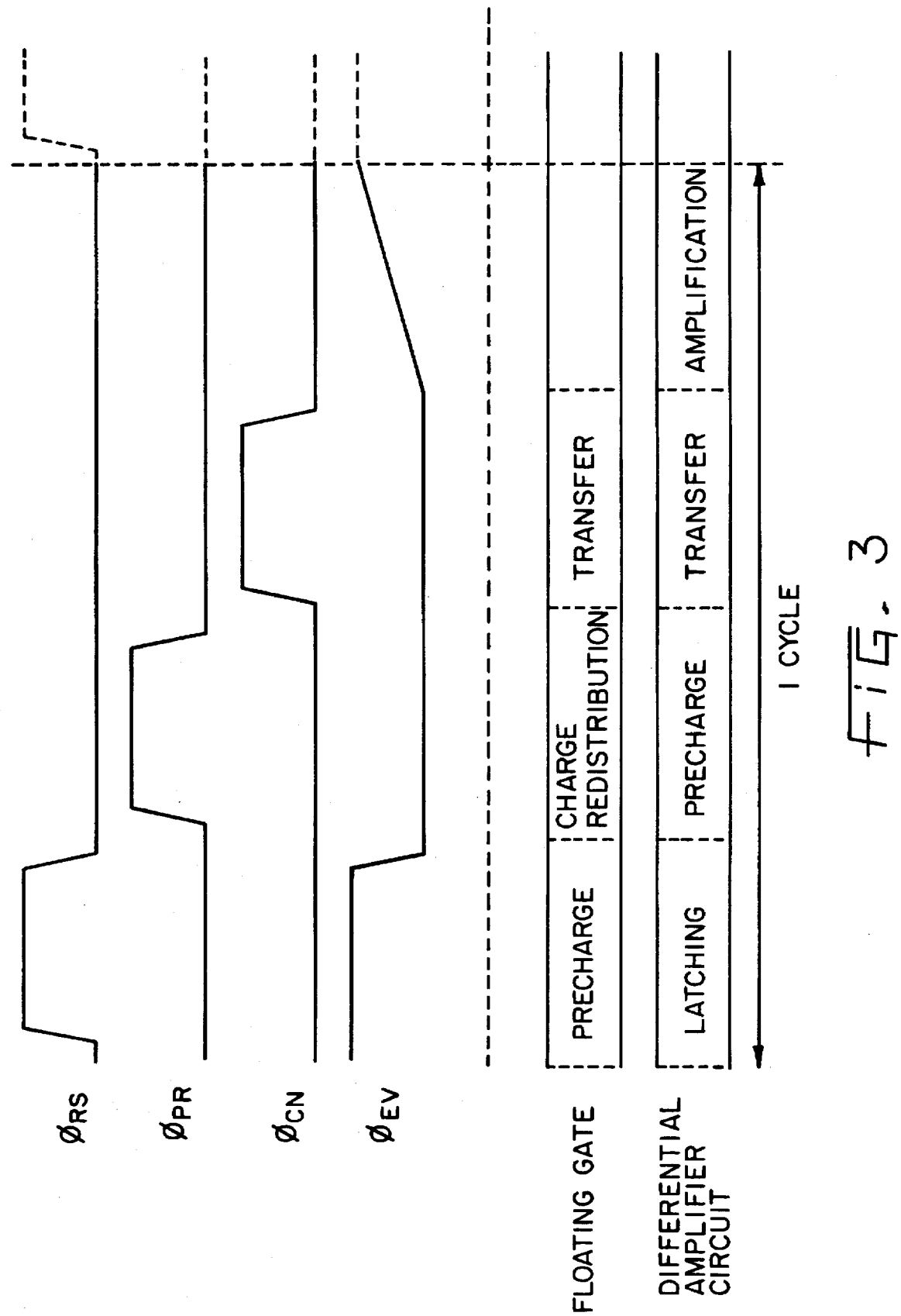
FIG. 3 is a timing chart of the clock signal which drives the basic logical calculation circuit of FIG. 1.

Here, the details of the operation of the circuit of FIG. 1 will be explained. FIG. 3 is a timing chart of the clock signal which drives the basic logical calculation circuit of FIG. 1. In the initial period, in which $\Phi_{RS}$ and $\Phi_{EV}$ have a value of 1, switch 109 and switch 111 are both in an ON state, so that the differential amplifier circuit conducts a latching operation, and contact points 106 and 107 assume a state in which the values thereof are, respectively, 1 and 0, or 0 and 1. That is to say, the potentials of contact point 106 and contact point 107 are the potentials of 0 V and $V_{DD}$, which differ from one another. The value thereof is determined by the result of the previous cycle logical calculation. At this time, by means of switches 117 and 118, the potentials of contact point 106 and contact point 107 are outputted to inversion output terminal 119 and output terminal 120, and the previous cycle calculation result is transmitted to the input terminal of the neuron MOS of the following stage basic logical calculation circuit. In the same way, the previous stage calculation result is inputted into the input terminal of the neuron MOS of the same basic logical circuit during this period. Switch 112 is in an ON state during this period, so that floating gate 101 is biased at precharge voltage $V_{PR}$. That is to say, in the first period, the floating gate is precharged, and the differential amplification circuit conducts a latching operation.

Next, in the second period, the value of $\Phi_{RS}$ and $\Phi_{EV}$ becomes 0, and the value of $\Phi_{PR}$ becomes 1. At this time, the floating gate 101 becomes electrically floating, and a charge corresponding to the potential difference between a value obtained when the voltages inputted into the plurality of input terminals of the neuron MOS during the first period are added and averaged at the floating gate level, and the precharge voltage $V_{PR}$ of the floating gate 101, remains in floating gate 101 and is stored. At the same time, control is exerted such that, among the plurality of input terminals of the neuron MOS, the input terminal corresponding to half the sum of the coupling capacity is biased at $V_{DD}$, and the remainder of the input gates are biased at the ground potential (0 V), and a state results in which a potential of $V_{DD}/2$ is equivalently inputted into all input terminals. At this time, the redistribution of the charge within the floating gate takes place, and a value resulting from the subtraction, from $V_{DD}/2$, of the potential corresponding to the input of the first period which was previously stored in the floating gate, is added to the precharge voltage $V_{PR}$, and this potential appears in floating gate 101. Furthermore, in the second period, the switches 109 and 111 of the differential amplifier circuit enter an OFF state, and the latch state is ended. simultaneously, switches 113 and 114 enter an ON state, and the contact points 106 and 107, which are the differential input terminals of the differential amplifier circuit, are biased at the precharge voltage $V_{PR}$. That is to say, the differential amplifier circuit is reset, and the differential input terminals are initialized at the same potential. In other words, in the second period, the floating gate carries out a charge redistribution, while the differential amplifiers circuit undergoes a precharge operation.

In the third period, the value of $\Phi_{PR}$ becomes 0, while the value of $\Phi_{CN}$ becomes 1. Accordingly, first, the precharging of the differential amplifier circuit is ended and floating gate 101 and precharge voltage $V_{PR}$ are connected to the differential input terminals, that is to say, contact points 106 and 107, via, respectively, switches 115 and 116. Accordingly, the charge of the floating gate is further redistributed between the capacity on the contact point 106 and the capacity on the floating gate, and the potential of contact point 106 is pulled by the potential of the floating gate, and changes from the precharge $V_{PR}$. On the other hand, the potential of contact point 107 remains at the precharge voltage $V_{PR}$ even during this period, so that a potential difference is generated between the differential input terminals, that is to say, between contact points 106 and 107. In other words, in the third period, the floating gate and the differential amplifier circuit are connected, and the initial values are set in the differential amplifier circuit.

In the fourth period, the value of $\Phi_{CN}$ is first set to 0. Accordingly, the differential input terminals, that is to say, contact points 106 and 107, are cut off from the floating gate and the precharge voltage, and an equal capacity having the smallest possible value exists in both contact points. Next, the switch 111 is driven by the clock signal $\Phi_{EV}$, which slowly changes from a value of 0 to a value of 1, and the potential of the contact point 110 is slowly lowered in the direction of the ground voltage (0 V). By means of this process, the difference in potential between the differential input terminals, that is to say contact points 106 and 107, is amplified. During this period, switch 139 is in an OFF state, so that no current flows through the inverter, and it is possible to restrict power consumption. In other words, during the fourth period, amplification is carried out in the differential amplifier circuit.

Next, operation is repeated from the first period; however, at the point in time at which transfer is made from the fourth period to the first period, the value of $\Phi_{RS}$ changes from 0 to 1, the switch 109 of the differential amplifier circuit enters an ON state, and a determination is made as to whether the potential of the differential input terminals which were amplified in the fourth period, that is to say, contact points 106 and 107, is the ground potential or $V_{DD}$, and this value is latched.

The first through fourth periods described above together constitute the operation of one cycle. In the circuitry shown in FIG. 2, the first stage basic logical calculation blocks and the second stage basic logical calculation block use the same clock signal, and the data flow in a pipeline form by one stage per cycle.

Figure 4:
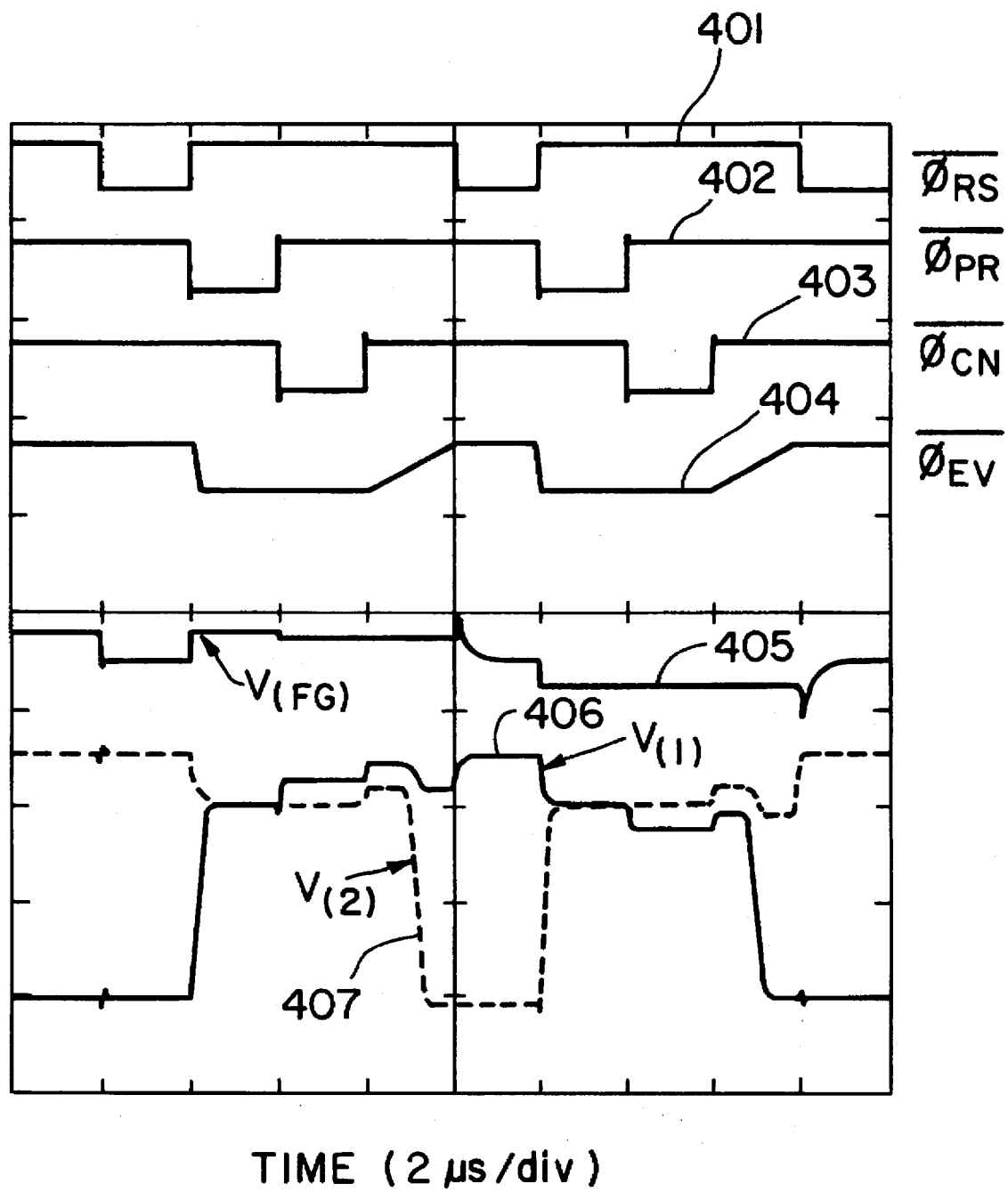
FIG. 4 shows the operational waveform of the basic logical calculation circuit of FIG. 1.

FIG. 4 shows the operational waveform of the basic logical calculation circuit of FIG. 1. Wave form 401 is an inversion signal of the clock signal $\Phi_{RS}$, waveform 402 is an inversion signal of signal $\Phi_{PR}$, waveform 403 is an inversion signal of $\Phi_{CN}$, waveform 404 is an inversion signal of $\Phi_{EV}$, waveform 405 is the potential of the floating gate 101, waveform 406 indicates the potential of the contact point 106, and waveform 407 indicates the potential of the contact point 107. In the third period, the potential of contact point 106 changes, and it can be seen that in the fourth period, the difference in potential with contact point 107 is amplified. Furthermore, at the point in time at which transition is effected from the third period to the fourth period, the potentials of contact points 106 and 107 are both shifted in a positive direction. This is switching noise resulting from switches 115 and 116; however, MOS transistors having identical dimensions are used as the switches 115 and 116, so that the amount of potential change is identical for contact points 106 and 107. Accordingly, no switching noise effect is generated during differential amplification in the fourth period.

Figure 5:
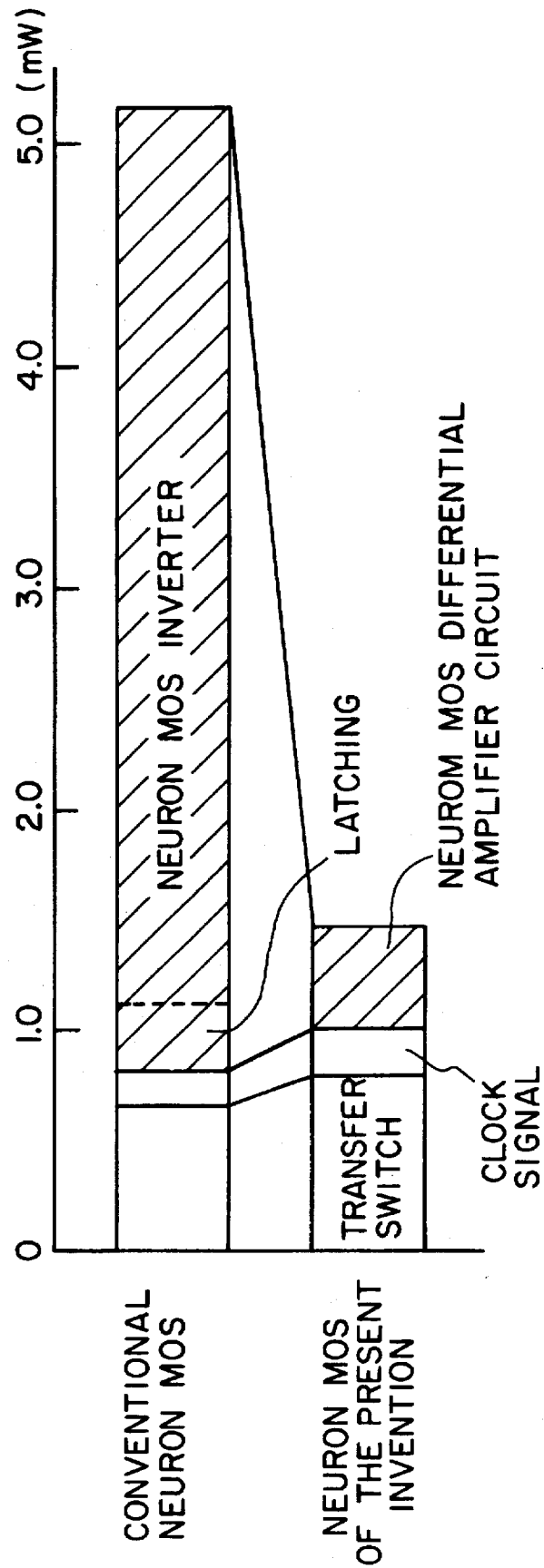
FIG. 5 is a graph comparing the power consumption in a neuron MOS logical circuit employing conventional neuron MOS inverters and a neuron MOS logical circuit in accordance with the present invention.

FIG. 5 shows the results of a comparison of power consumption in a neuron MOS logical circuit employing conventional neuron MOS inverters and the neuron MOS logical circuit of the present invention. By means of the present invention, only approximately ⅛ of the power consumed by the conventional neuron MOS inverter is employed. Less than ⅓ the power is consumed even if the power consumption of the circuit is as a whole is considered.

In the present embodiment, CMOS inverters comprising PMOS transistors and NMOS transistors were employed as the inverter circuits comprising the differential amplification circuit; however, other circuits may be employed insofar as they are inverter circuits, so that for example, resistance load inverters or E/D inverters may be employed. Furthermore, a form was shown in which a floating gate was provided only on one side of the two input terminals of the differential amplification circuits; however, different floating gates may be connected to both of the differential input terminals, and in particular, by means of inputting mutually inverted signals into input terminals which are coupled with two floating gates and conducting calculations, a greater degree of amplification can be achieved. Additionally, a structure was shown in which switch elements 109 and 111 were interposed on the power source side and ground side of the differential amplification circuits; however, either one may be present only on one side, and furthermore, although this would increase the power consumption, it is not necessary to interpose the switching elements. Additionally, a structure was shown in which switches 115 and 116 were disposed between the contact points 106 and 107, which comprised the input terminals of the differential input circuit and floating gate 101 and precharge power source $V_{PR}$; however, if the capacity value on the contact points 106 and 107 which comprise the differential input terminals is equal, these switches 115 and 116 are not necessary.

Furthermore, a signal having a gradually changing voltage value was employed as the clock signal $\Phi_{EV}$ controlling the differential amplification; however, a signal which rapidly changes in the manner of a common clock signal may be employed. Additionally, the method of clock control is not limited to that shown in the present embodiment.

(Second Embodiment)

Figure 6:
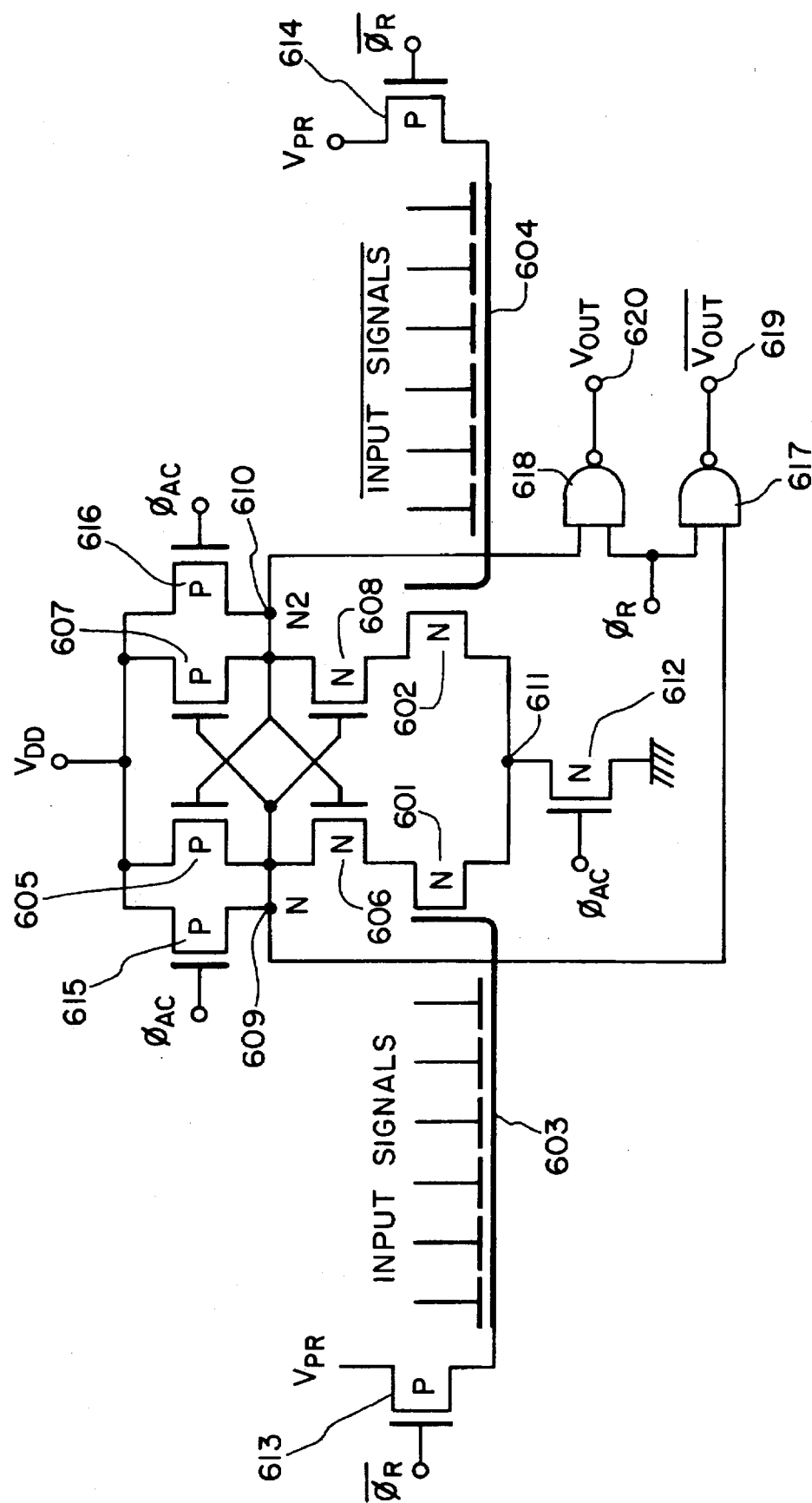
FIG. 6 is a structural circuit diagram showing a second embodiment of the present invention.

FIG. 6 is a structural circuit diagram showing a second embodiment of the present invention. In the Figure, reference 601 and 602 indicate neuron MOS transistors, while references 603 and 604 indicate the floating gates of these neuron MOS transistors. References 605 and 606 indicate, respectively, a PMOS transistor and An NMOS transistor; these form a first inverter circuit. Additionally, references 607 and 608 indicate, respectively, a PMOS transistor and an NMOS transistor; these form a second inverter circuit. The output of the first inverter and the input of the second inverter, as well as the output of the second inverter and the input of the first inverter, are connected at, respectively, first contact point 609 and second contact point 610. The source electrodes of neuron MOS transistors 601 and 602 are connected at a third contact point 611, and contact point 611 is connected to the ground terminal by means of the NMOS transistor 612 which enters an ON state in response to the clock signal $\Phi_{AC}$. The circuit formed by transistors 605, 606, 607, and 608 comprises a differential amplification circuit. Floating gates 603 and 604 are connected to a precharge power source $V_{PR}$ through PMOS transistors 613 and 614, which enter an ON state when the inversion signal of $\Phi_R$ is inputted into the gate electrode and $\Phi_R$ has a value of 1. Additionally, contact points 609 and 610 are connected to power source $V_{DD}$ through PMOS transistors 615 and 616, which enter an ON state when the clock signal $\Phi_{AC}$ is inputted into the gate electrode and $\Phi_{AC}$ has a value of 0. Furthermore, contact points 609 and 610 are connected to inversion output terminal 619 and output terminal 620 via $N_{AND}$ gates 617 and 618. $N_{AND}$ gates 617 and 618 are controlled by means of clock signal $\Phi_R$, and when $\Phi_R$ has a value of 1, the inversion signal of contact point 609 is outputted to inversion output terminal 619, and the inversion signal of contact point 610 is outputted to output terminal 620, while when $\Phi_R$ has a value of 0, a value of 1, that is to say, the power source voltage $V_{DD}$, is outputted to inversion output terminal 619 and output terminal 620.

Figure 7:
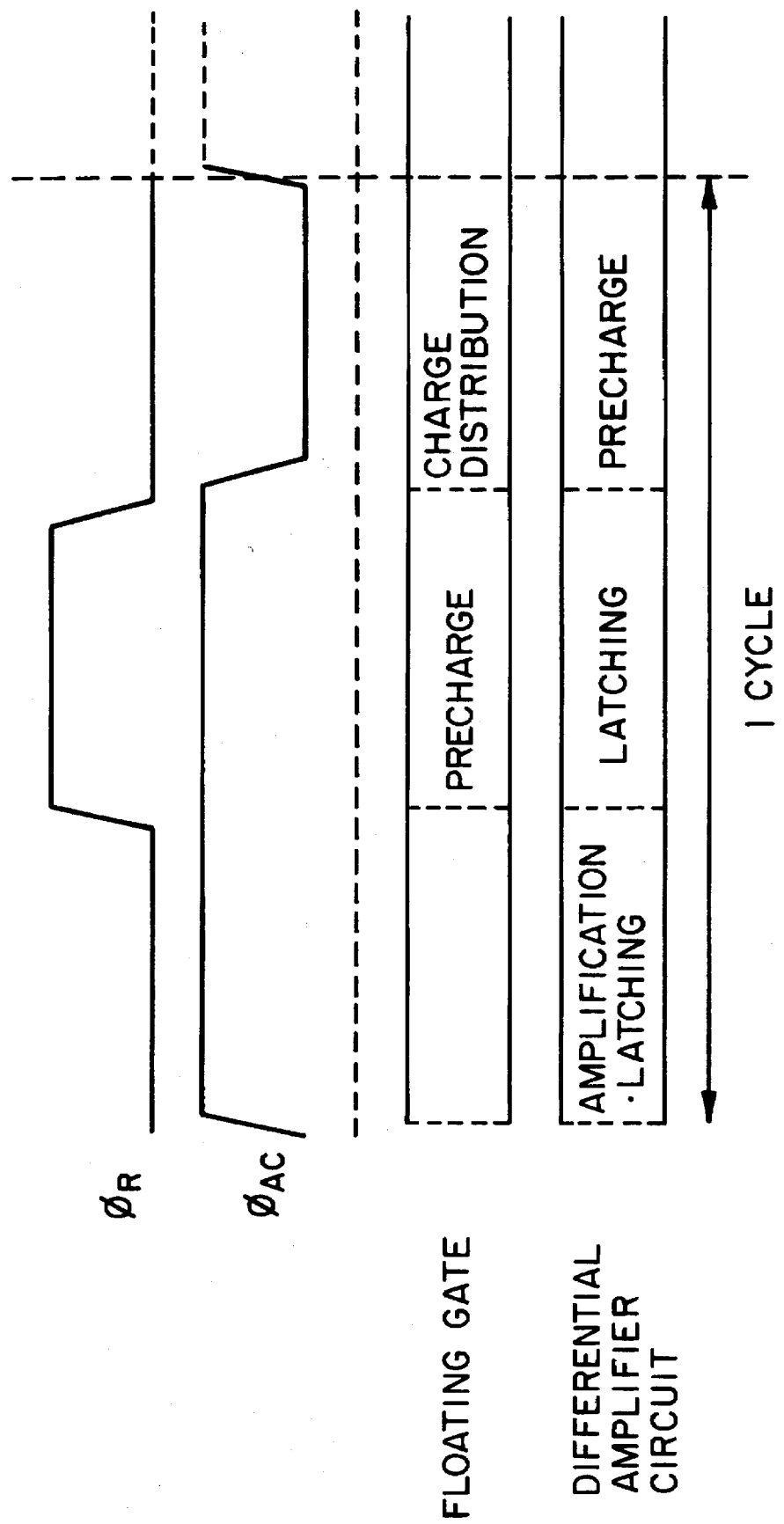
FIG. 7 is a timing chart of the clock signal which drives the basic logical calculation circuit of FIG. 6.

Here, the details of the operation of the circuit shown in FIG. 6 will be explained. FIG. 7 is a timing chart of the clock signals which drive the basic logical calculation circuit of FIG. 6. In the first period, in which the value of $\Phi_R$ is 0 while the value of $\Phi_{AC}$ is 1, NMOS transistor 612 is in an ON state, so that the differential amplification circuit conducts amplification and latching operations, and a state is attained in which the value of contact points 609 and 610 is, respectively, 1 and 0, or 0 and 1. That is to say, the potentials of contact points 609 and 610 differ from one another, and are either 0 V or $V_{DD}$. These values are the result of the logical calculations of the previous cycle. That is to say, in the first period, the differential amplification circuit conducts amplification and latching operations.

Next, in the second period, the value of both $\Phi_R$ and $\Phi_{AC}$ becomes 1. At this time, by means of $N_{AND}$ gates 617 and 618, the inversion signal of the potentials of contact points 609 and 610 are outputted to inversion output terminal 619 and output terminal 620, and the calculation results which were determined and latched during the first period are transmitted to the input terminals of the neuron MOS of the following stage basic logic calculation circuit. In the same way, the calculation results of the previous stage are inputted into the input terminal of the neuron MOS of the same basic logical circuit during this period. PMOS transistors 613 and 614 enter an ON state during this period, so that floating gates 603 and 604 are biased at the precharge voltage $V_{PR}$. That is to say, in the second period, the floating gates are subjected to precharging, while the differential amplification circuit conducts a latching operation.

In the third period, the value of both $\Phi_R$ and $\Phi_{AC}$ becomes 0. At this time, floating gates 603 and 604 become electrically floating, and a charge corresponding to the difference in potential between a value resulting from the addition and averaging, at the floating gate level, of the voltages inputted into the plurality of input terminals of the neuron MOS during the second period, and the precharge voltage $V_{PR}$ of the floating gate, remains in the floating gate and is stored. At the same time, control is conducted so that the input terminal among the plurality of input terminals of the neuron MOS corresponding to half of the sum of the coupling capacities is biased at $V_{DD}$, while the remaining input gates are biased at the ground potential (0 V), and a potential of $V_{DD}/2$ is equivalently inputted into all input terminals. At this time, a redistribution of the charge in the floating gate occurs, and a value resulting from the subtraction, from $V_{DD}/2$, of a potential corresponding to the input of the second period stored immediately previously in the floating gate is added to the precharge voltage $V_{PR}$, and this potential appears in floating gates 603 and 604.

In the second period, signals which are mutually reversed in phase are inputted into the input terminals of neuron MOS transistors 601 and 602, so that the change in the floating gate potential which is generated during this third period is in a direction opposite to that of 603 and 604, and in comparison with a form in which the floating gate is present on only one side, there is an increase in the degree of the differential amplification which results. Furthermore, in the third period, the NMOS transistor 612 of the differential amplification circuit enters an OFF state, and the latch state is cancelled. At the same time, the PMOS transistors 615 and 616 enter an ON state, and the contact points 609 and 610 which are the differential terminals of the differential amplification circuit are biased at the precharge voltage $V_{DD}$. That is to say, the differential amplification circuit is reset, and the differential terminals are initialized at an equal potential. That is to say, in this third period, the floating gates carry out a charge redistribution operation, while the differential amplification circuit carries out a precharge operation.

Next, operations are repeated from the first period; however, at the point of transition from the third period to the first period, the value of $\Phi_{AC}$ changes from 0 to 1, the NMOS transistor 612, which controls the differential amplification circuit, enters an ON state, and the potential of the contact point 611 is slowly reduced in the direction of the ground voltage (0 V). In this process, as a result of the difference in the floating gate potentials of the neuron MOS transistors 601 and 602, the drain conductances of the neuron MOS transistors 601 and 602 are different, and the rate of change in the potentials of the differential terminals, that is to say, contact points 609 and 610, is different. As a result, a difference in potential is generated between contact points 609 and 610, and after this, this difference in potential is automatically amplified and latched.

The first through third periods described above form the operation of one cycle. In comparison with the circuit of the first embodiment (FIG. 1), fewer steps are required for the operation of one cycle, and higher speed operation is possible. Furthermore, using two types of clock signals, the clock wiring is simplified.

In the present embodiment, CMOS inverters comprising PMOS transistors and NMOS transistors were employed as the inverter circuits comprising the inverter circuits of the differential amplification circuit; however, other circuits may be employed insofar as they are inverter circuits, so that for example, resistance load inverters or E/D inverters may be employed. Furthermore, an N-type neuron MOS transistor was disposed between the differential amplification circuit and the ground line; however, a P-type neuron MOS transistor may be employed and furthermore, the transistor may be disposed between the differential amplification circuit and the power source line $V_{DD}$. Additionally, neuron MOS transistors were provided on both sides of the two differential terminals of the differential amplification circuit; however, these may be disposed on only one side thereof, and on the other side, a MOS transistor having the precharge voltage $V_{PR}$ connected to the gate thereof may be disposed. Furthermore, a form was shown in which a switch element 612 was interposed only on the ground side of the differential amplification circuit; however, this may be disposed only on the power source side of the differential amplification circuit as well, and furthermore, may be disposed on both sides, or alternatively, although this increases the power consumption, the switch elements need not be interposed. Furthermore, NMOS transistors, PMOS transistors, and $N_{AND}$ gates were employed as the switch elements; however, other structural elements having other functions maybe employed. The method of clock control is not necessarily limited to that shown in the present embodiment.

What is claimed is:

1. A semiconductor integrated circuit, comprising a first inverter having an input and an output;

a second inverter having an input connected to said first inverter output at a first contact point and an output connected to said first inverter input at a second contact point;

an electrode operatively connected to one of said first contact point and said second contact point; and a plurality of input electrodes capacitively coupled with said electrode, the potential difference between said first contact point and said second contact point determined by the respective potentials applied to said input electrodes.

2. The semiconductor integrated circuit according to claim 1, wherein said electrode is operatively connected to one of said first contact point and said second contact point through a switch element.

3. A semiconductor integrated circuit, comprising a first inverter having an input and an output;

a second inverter having an input connected to said first inverter output at a first contact point and an output connected to said first inverter input at a second contact point; and an MOS transistor connected in series with one of said first inverter and said second inverter, said MOS transistor having a floating gate electrode, said MOS transistor floating gate electrode capacitively coupled with a plurality of input electrodes, the potential difference between said first contact point and said second contact point determined by the respective potentials applied to said input electrodes.

* * * * *